(12) United States Patent
Kilzer et al.

(10) Patent No.: US 9,450,585 B2
(45) Date of Patent: Sep. 20, 2016

(54) SELECTING FOUR SIGNALS FROM SIXTEEN INPUTS

(75) Inventors: Kevin Lee Kilzer, Chandler, AZ (US); Sean Steedman, Phoenix, AZ (US); Jerrold S. Zdenek, Riverside, IL (US); Vivien N. Delport, Chandler, AZ (US); Zeke Lundstrum, Chandler, AZ (US); Fanie Duvenhage, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 284 days.

(21) Appl. No.: 13/449,687

(22) Filed: Apr. 18, 2012

(65) Prior Publication Data

US 2012/0268193 A1    Oct. 25, 2012

Related U.S. Application Data

(60) Provisional application No. 61/477,443, filed on Apr. 20, 2011.

(51) Int. Cl.
*H03K 19/173* (2006.01)
*H03K 19/177* (2006.01)

(52) U.S. Cl.
CPC .... *H03K 19/1737* (2013.01); *H03K 19/17744* (2013.01)

(58) Field of Classification Search
CPC .................. H03K 19/1776; H03K 19/17728
USPC ...................................................... 326/30–49
See application file for complete search history.

(56) References Cited

U.S. PATENT DOCUMENTS

| | | | |
|---|---|---|---|
| 3,643,232 A | 2/1972 | Kilby | 326/9 |
| 4,292,548 A | 9/1981 | Suarez et al. | 326/37 |
| 5,298,805 A * | 3/1994 | Garverick | H03K 17/223 326/37 |
| 5,742,180 A * | 4/1998 | DeHon | G06F 15/7867 326/38 |
| 5,809,319 A | 9/1998 | Kim et al. | 712/33 |
| 5,910,732 A * | 6/1999 | Trimberger | H03K 19/17736 326/38 |
| 6,128,770 A | 10/2000 | Agrawal et al. | 326/37 |
| 6,184,707 B1 * | 2/2001 | Norman | H03K 19/17728 326/38 |
| 6,188,241 B1 | 2/2001 | Gauthier et al. | 326/41 |
| 6,229,337 B1 | 5/2001 | Xiao et al. | 326/41 |
| 6,260,087 B1 | 7/2001 | Chang | 710/100 |
| 6,288,563 B1 | 9/2001 | Muljono et al. | 326/27 |

(Continued)

FOREIGN PATENT DOCUMENTS

| | | | |
|---|---|---|---|
| CN | 1052202 A | 6/1991 | G06F 13/24 |
| CN | 1080740 A | 1/1994 | G05B 19/05 |

(Continued)

OTHER PUBLICATIONS

XILINX, "XC9500 In-System Programmable CPLD Family," 14 pages, Jun. 1, 1996.

(Continued)

*Primary Examiner* — Jason M Crawford
*Assistant Examiner* — Kurtis R Bahr
(74) *Attorney, Agent, or Firm* — Slayden Grubert Beard PLLC

(57) ABSTRACT

An apparatus for selecting a plurality of input signals from a plurality of y signals in a device has a switching matrix with a plurality of n to 1 mulitplexers, wherein each n to 1 multiplexer is assigned to a different input set of n of the y signals wherein a subset of less than n input signals of each set of input signals of each of the n to 1 multiplexers is also a subset of input signals of another n to 1 multiplexer.

24 Claims, 8 Drawing Sheets

(56) References Cited

U.S. PATENT DOCUMENTS

| | | | |
|---|---|---|---|
| 6,292,019 B1 * | 9/2001 | New | H03K 19/1737 326/38 |
| 6,460,172 B1 | 10/2002 | Insenser Farre et al. | 326/38 |
| 6,467,009 B1 | 10/2002 | Winegarden et al. | 710/305 |
| 6,476,634 B1 | 11/2002 | Bilski | 326/40 |
| 6,605,959 B1 * | 8/2003 | Morse | H03K 19/1737 326/38 |
| 6,637,017 B1 | 10/2003 | Brophy | 326/39 |
| 6,798,240 B1 * | 9/2004 | Pedersen | H03K 19/17728 326/39 |
| 6,803,785 B1 * | 10/2004 | May | G06F 15/7867 326/38 |
| 6,943,580 B2 * | 9/2005 | Lewis | H03K 19/17728 326/37 |
| 6,948,147 B1 | 9/2005 | New et al. | 716/117 |
| 7,028,281 B1 | 4/2006 | Agrawal et al. | 326/41 |
| 7,062,520 B2 | 6/2006 | Rupp | 708/230 |
| 7,119,575 B1 * | 10/2006 | Schleicher | H03K 19/1737 326/38 |
| 7,221,198 B2 | 5/2007 | Tokunaga et al. | 327/141 |
| 7,227,378 B2 | 6/2007 | Blodget et al. | 326/38 |
| 7,271,617 B2 | 9/2007 | Leijten-Nowak | 326/38 |
| 7,545,167 B2 * | 6/2009 | Teig | H03K 19/17736 326/38 |
| 7,592,834 B1 * | 9/2009 | Agrawal | H03K 19/17736 326/38 |
| 7,675,321 B1 * | 3/2010 | Agrawal | H03K 19/17728 326/38 |
| 7,689,726 B1 * | 3/2010 | Sundararajan | G06F 9/4401 326/38 |
| 7,812,635 B1 | 10/2010 | Hutton et al. | 326/39 |
| 7,873,811 B1 * | 1/2011 | Wolinski | G06F 15/17337 712/15 |
| 8,026,739 B2 | 9/2011 | Sullam et al. | 326/39 |
| 8,082,284 B2 | 12/2011 | Leijten-Nowak | 708/235 |
| 8,549,258 B2 | 10/2013 | Lee et al. | 712/15 |
| 8,627,057 B2 | 1/2014 | Baxi | 713/100 |
| 2002/0157078 A1 | 10/2002 | Wang et al. | 716/121 |
| 2003/0062922 A1 | 4/2003 | Douglass et al. | 326/39 |
| 2007/0271060 A1 | 11/2007 | Fletcher | 702/132 |
| 2008/0136449 A1 * | 6/2008 | Hutton | H03K 19/17736 326/47 |
| 2008/0263334 A1 | 10/2008 | Synder et al. | 712/221 |
| 2009/0113169 A1 | 4/2009 | Yang et al. | 712/15 |
| 2009/0160481 A9 * | 6/2009 | Schmit | H03K 19/1737 326/38 |
| 2010/0122007 A1 | 5/2010 | Lahti et al. | 710/262 |
| 2010/0205343 A1 | 8/2010 | Tell | 710/305 |
| 2012/0068733 A1 | 3/2012 | Fletcher et al. | 326/39 |
| 2012/0268163 A1 | 10/2012 | Kilzer et al. | 326/37 |
| 2012/0271968 A1 | 10/2012 | Kilzer et al. | 710/12 |

FOREIGN PATENT DOCUMENTS

| | | | |
|---|---|---|---|
| CN | 1263618 A | 8/2000 | G01R 31/28 |
| CN | 1643793 A | 7/2005 | H03K 19/173 |
| CN | 1751361 A | 3/2006 | G06F 17/50 |
| EP | 03/06962 A2 | 3/1989 | G06F 15/78 |
| TW | I246280 B | 12/2005 | G06F 1/04 |
| TW | I259973 B | 8/2006 | G06F 9/00 |
| TW | I312465 B | 7/2009 | G06F 13/10 |
| TW | 201112117 A | 4/2011 | G06F 9/30 |

OTHER PUBLICATIONS

International Search Report and Written Opinion, Application No. PCT/US2012/034250, 9 pages, Dec. 14, 2012.
International PCT Search Report and Written Opinion, PCT/US2012/034245, 9 pages, Jun. 28, 2012.
International PCT Search Report and Written Opinion, PCT/US2012/034367, 11 pages, Sep. 27, 2012.
International PCT Search Report and Written Opinion, PCT/US2012/034242, 12 pages, Aug. 2, 2012.
"UPSD3422, UPSD3433, UPSD3434 UPSD3454 Turbo Plus Series, Fast Turbo 8032 MCU with USB and Programmable Logic", www.st.com, 300 pages, Jan. 2009.
Altera, "Increasing Design Functionality with Partial and Dynamic Reconfiguration in 28-nm FPGAs," 9 pages, Jul. 2010.
Dye, David, "Partial Reconfiguration of Xilinx FPGAs Using ISE Design Suite," XILINX, WP374 (v1.2), 8 pages, May 30, 2012.
U.S. Advisory Action, U.S. Appl. No. 13/450,079, 3 pages, Sep. 2, 2015.
Chinese Office Action, Application No. 201280019340.8, 11 pages, Sep. 30, 2015.
U.S. Final Office Action, U.S. Appl. No. 13/449,850, 42 pages, Oct. 5, 2015.
Chinese Office Action, Application No. 201280019050.3, 7 pages, Aug. 26, 2015.
U.S. Advisory Action, U.S. Appl. No. 13/449,850, 3 pages, Jan. 29, 2016.
Chinese Office Action, Application No. 201280019045.2, 9 pages, Jan. 4, 2016.
Taiwan Office Action, Application No. 101114279, 5 pages, Mar. 28, 2016.
Taiwan Office Action, Application No. 101114280, 5 pages, Mar. 28, 2016.
U.S. Non-Final Office Action, U.S. Appl. No. 13/449,850, 41 pages, Mar. 8, 2016.
Chinese Office Action, Application No. 201280019050.3, 4 pages, Jun. 29, 2016.

\* cited by examiner

SELECTING FOUR SIGNALS FROM SIXTEEN INPUTS

CROSS-REFERENCE TO RELATED APPLICATIONS

This application claims the benefit of U.S. Provisional Application No. 61/477,443 filed on Apr. 20, 2011, which is incorporated herein in its entirety. This application is related to co-pending U.S. patent application Ser. No. 13/449,850, filed on Apr. 18, 2012; U.S. patent application Ser. No. 13/449,993, filed on Apr. 18, 2012; and U.S. patent application Ser. No. 13/450,079 filed on Apr. 18, 2012; all filed concurrently herewith and incorporated by reference in their entirety.

TECHNICAL FIELD

The present disclosure relates to selecting input signals with multiplexers, and, more particularly, to selecting a first plurality out of a first group of signals and one or more of another group of signals simultaneously.

BACKGROUND

Within microcontrollers, systems on chip devices, etc., certain peripherals may require a plurality of internal and external signals selected from one or more groups of internal and/or external signals. In conventional systems multiplexer are used to provide for such a selection. However, with an increasing number of possible candidates for such signals, the complexity of the multiplexer increases substantially and therefore these multiplexers consume valuable integrated circuit real estate. For example, to reduce the number of multiplexer, according to one example, it may be required that four (4) signals be selected from a constellation of 16 signals, but with the constraint that only 8-input multiplexers can be employed, maximizing the number of combinations that can be achieved and minimizing the cost of the silicon implementation of the multiplexers. Thus, each of the four signals is assigned one 8-to-1 multiplexer. However, this allows for each signal only a pool of eight signals. Thus, in an embodiment, each signal can be selected from a group of 8 source signals. If there are 16 source signals, then for example, two sets of 8-to-1 multiplexers would be assigned to the first eight signals and the other two to the second eight signals, which would allow only 2 signals from 2 groups.

SUMMARY

Therefore a need exists for a technique and circuit for providing an improved selection of source signals for a peripheral device within a microcontroller, system on a chip device, etc.

According to an embodiment, an apparatus for selecting a plurality of input signals from a plurality of y signals in a device may comprise a switching matrix comprising a plurality of n-to-1 multiplexers, wherein each n-to-1 multiplexer is assigned to a different input set of n of said y signals wherein a subset of less than n input signals of each set of input signals of each of the n-to-1 multiplexers is also a subset of input signals of another n-to-1 multiplexer.

According to a further embodiment, the apparatus may comprise a mode register coupled with the switching matrix allowing to program one of a plurality of assignment modes, wherein in a first assignment mode the switching matrix operates to assign said different input sets with overlapping input signals to said plurality of n-to-1 multiplexers and in a second assignment mode, the switching matrix assigns a first input set to all n-to-1 multiplexers. According to a further embodiment, the apparatus may comprise a mode register coupled with the switching matrix, wherein in a first mode programmed in the mode register the switching matrix operates to assign said different input sets with overlapping input signals to said plurality of n-to-1 multiplexers and in a second mode, the switching matrix assigns at least a first input set to at least one n-to-1 multiplexers and at least a second input set with no input signals overlapping with the first input set to at least another n-to-1 multiplexer. According to a further embodiment, in the second mode, the first input set can be assigned to at least two n-to-1 multiplexers and the second input set to at least two further n-to-1 multiplexers. According to a further embodiment, the apparatus may comprise a mode register coupled with the switching matrix allowing to program one of a plurality of assignment modes, wherein in a first assignment mode the switching matrix operates to assign said different input sets with overlapping input signals to said plurality of n-to-1 multiplexers, in a second assignment mode, the switching matrix assigns a first input set to all n-to-1 multiplexers, and in a third assignment mode, the switching matrix assigns at least a first input set to at least one n-to-1 multiplexers and at least a second input set with no input signals overlapping with the first input set to at least another n-to-1 multiplexer. According to a further embodiment, in the third mode, the first input set can be assigned to at least two n-to-1 multiplexers and the second input set to at least two further n-to-1 multiplexers. According to a further embodiment, the selected input signals are fed to a peripheral device. According to a further embodiment, the peripheral device can be a programmable logic cell within a microcontroller. According to a further embodiment, the apparatus may be designed for selecting four (4) signals from sixteen (16) inputs, and may comprise first, second, third and fourth multiplexers, each of the multiplexers having eight (8) inputs and one (1) output; wherein input signals 0 to 3 are coupled respectively to four inputs of the first and fourth multiplexers, input signals 4 to 7 are coupled respectively to another four inputs of the first multiplexer and four inputs of the second multiplexer, input signals 8 to 11 are coupled respectively to another four inputs of the second multiplexer and four inputs of the third multiplexer, and input signals 12 to 15 are coupled respectively to another four inputs of the third multiplexer and another four inputs of the fourth multiplexer; whereby any 3 of the 8 signals are selected and 1 of the other 8 signals is selected to the outputs of the four multiplexers.

According to another embodiment, a method for selecting a plurality of input signals from a plurality of y signals in a device by a plurality of n-to-1 multiplexers may comprise assigning each n-to-1 multiplexer to a different input set consisting of n input signals of said y signals wherein a subset of less than n input signals of each set of input signals for each of the n-to-1 multiplexers is also a subset of input signals of another n-to-1 multiplexer thereby creating overlapping input signals for each n-to-1 multiplexer.

According to a further embodiment, the above method may further comprise selecting an assignment mode form a plurality of assignment modes, wherein in a first assignment mode said different input sets with overlapping input signals are assigned to said plurality of n-to-1 multiplexers and in a second assignment mode, a first input set is assigned to all n-to-1 multiplexers. According to a further embodiment, the above method may further comprise selecting an assignment mode form a plurality of assignment modes, wherein in a first mode said different input sets with overlapping input signals are assigned to said plurality of n-to-1 multiplexers and in a second mode, at least a first input set is assigned to at least one n-to-1 multiplexers and at least a second input set with no input signals overlapping with the first input set is assigned to at least another n-to-1 multiplexer. According to a further embodiment of the above method, in the second mode, the first input set can be assigned to at least two n-to-1 multiplexers and the second input set to at least two further n-to-1 multiplexers. According to a further embodiment, the above method may further comprise selecting an assignment mode form a plurality of assignment modes, wherein in a first assignment mode said different input sets with overlapping input signals are assigned to said plurality of n-to-1 multiplexers, in a second assignment mode, a first input set is assigned to all n-to-1 multiplexers, and in a third mode, at least a first input set is assigned to at least one n-to-1 multiplexers and at least a second input set with no input signals overlapping with the first input set is assigned to at least another n-to-1 multiplexer. According to a further embodiment of the above method, in the third mode, the first input set can be assigned to at least two n-to-1 multiplexers and the second input set to at least two further n-to-1 multiplexers. According to a further embodiment, the above method may further comprise feeding the selected input signals to a peripheral device. According to a further embodiment of the above method, the peripheral device can be a programmable logic cell within a microcontroller. According to a further embodiment, the above method may be designed for selecting four (4) signals from sixteen (16) inputs, and may comprise providing first, second, third and fourth multiplexers, wherein each of the multiplexers have eight (8) inputs and one (1) output; coupling a first four data signals to four inputs of the first and fourth multiplexers, respectively; coupling a second four data signals to another four inputs of the first multiplexer and four inputs of the second multiplexer, respectively; coupling a third four data signals to another four inputs of the second multiplexer and four inputs of the third multiplexer, respectively, and coupling a fourth four data signals to another four inputs of the third multiplexer and another four inputs of the fourth multiplexer, respectively; whereby any three of the eight signals are selected and one of the other eight signals is selected to the outputs of the four multiplexers.

DETAILED DESCRIPTION

Figure 1:
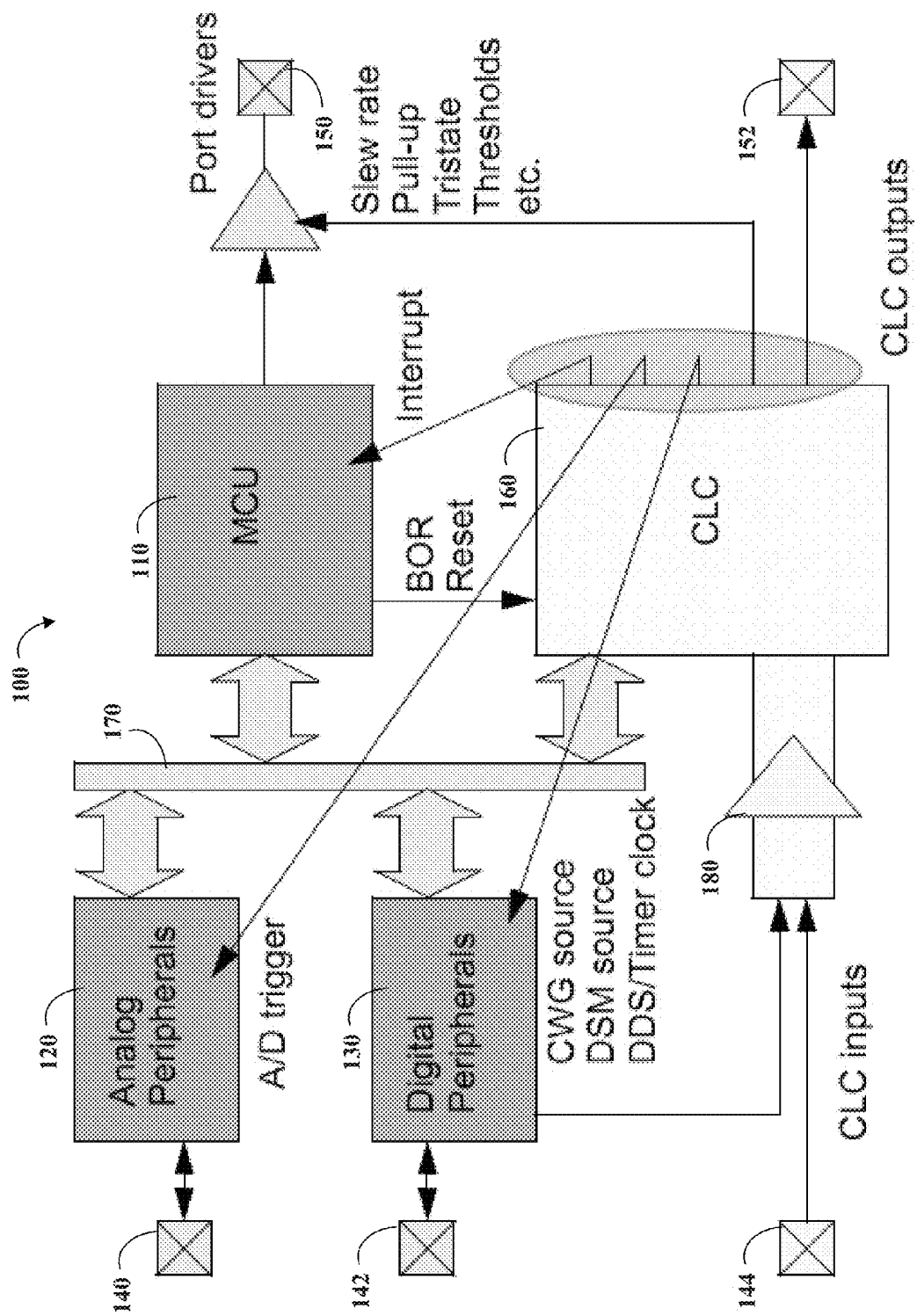
FIG. 1 shows a block diagram of an exemplary microcontroller.

FIG. 1 shows a typical microcontroller device 100 having a processing core 110, analog peripheral devices 120 and digital peripheral devices 130 coupled with the core 110 through an internal system bus 170. A further peripheral device, for example a configurable logic block, is indicated with numeral 160 and may be also coupled with the bus 170. In addition, this device may require further input signals that cannot be provided by the internal system bus 170. A plurality of additional input signals may come from one or more digital peripherals. These signals may be fed through a driver 180 to the additional peripheral 160. The peripheral 160 generates output signals which may be fed to any peripheral as trigger, source, clock or any other suitable signal. Furthermore, an output signal may also control a port driver for an external port 150 coupled with the core 110 or may drive an external output pin 152 directly. Also, an output signal can be used as an input signal for the core 110, for example as an interrupt signal. In the example shown in FIG. 1, as stated above, the additional peripheral device can be a configurable logic cell. According to one embodiment, such a logic cell may require four input signals and, for example, generate one output signal. The logic cell is configurable to provide for a plurality of different logic functions. To be most flexible, the input signals need to be selected from a pool of suitable input signals.

Figure 2:
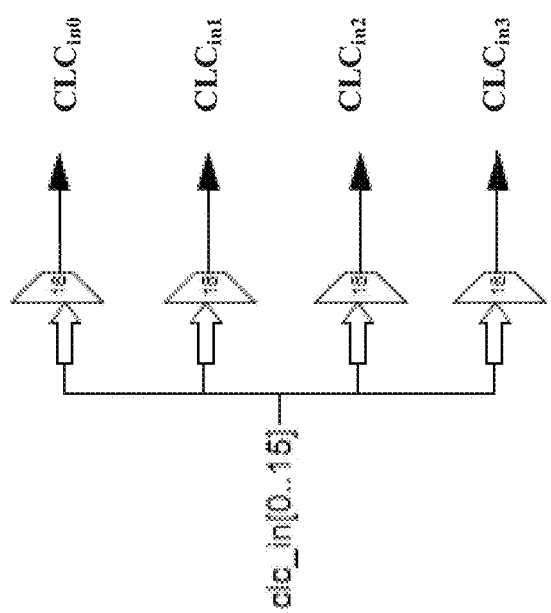

FIG. 2 show a first conventional selection circuit that allows each input signal to be selected from 16 different source signals. However, as mentioned above, this conventional selection circuit requires four 16-to-1 multiplexers, each having 16 inputs and one output, and therefore requires significant silicon real estate. Therefore, such an option may not always be possible, in particular in small microcontroller devices with a limited amount of silicon real estate.

Figure 3:
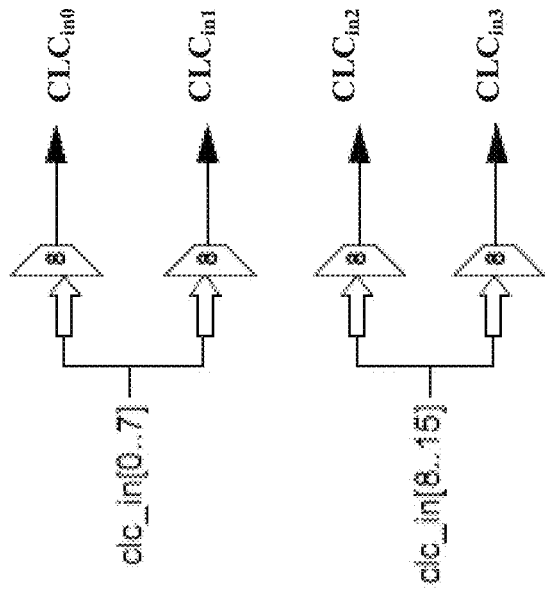
FIGS. 2 and 3 show conventional multiplexer arrangements for signal selection.

FIG. 3, shows a second conventional embodiment in which the source signals are split into two groups wherein the first group includes the lower input signals 0 . . . 7 and the other group the higher signals 8-15. Four 8-to-1 multiplexers, each having eight inputs and one output, are provided to select the respective input signals for the configurable logic cell 160. However, this embodiment is limited in its assignment functionality. There can be only 2 signals assigned to each group. This limitation may be too restricting for many applications rendering the internal configurable logic cell useless or requiring additional external hardware to compensate for these restrictions.

According to various embodiments, in a switching device, a plurality of n-to-1 multiplexers, each having at least n inputs and one output, is provided to select a plurality of input signals from a pool of y input signals, wherein n and y are integer numbers >1. Each n-to-1 multiplexer is assigned to a different input set of n of the y signals wherein a subset of less than n input signals of each set of input signals of each of the n-to-1 multiplexers is also a subset of input signals of another n-to-1 multiplexer.

Figure 4:
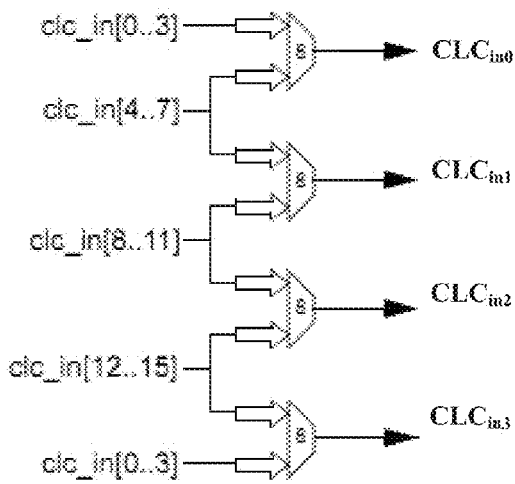
FIG. 4 shows an embodiment of a multiplexer arrangement according to the teachings of this disclosure.

Thus, the above principle allows for a different strategy with a more flexible assignment. FIG. 4 shows an example of this general concept. In this example, four N-TO-1 multiplexers are used, for example four 8-to-1 multiplexers. M available input source signals, for example, 16 input source signal clc_in[0 . . . 15] may be available for selection. These input source signals are divided into sub-groups, for example four groups (A, B, C, D) wherein the first group A includes signals clc_in[0 . . . 3], the second group B includes signal clc_in[4 . . . 7], the third group C includes signals clc_in[8 . . . 11] and the last group D includes signals clc_in[12 . . . 15]. Each group is then assigned to two different mulitplexers. The sub groups A, B, C, D, according to one embodiment, are distributed amongst the four (4) 8-to-1 multiplexers in the combinations AB, BC, CD, DA. In this specific embodiment, 3 signals from any two groups of 8 signals can be selected. Thus, the above mentioned principle allows for a more flexible assignment of internal and/or external signals. The embodiments are not restricted to 16 input signals and four selected signals. Other combinations can be obtained by forming sub-groups and assigning the sub-groups to the input of multiple mulitplexers.

Figure 5:
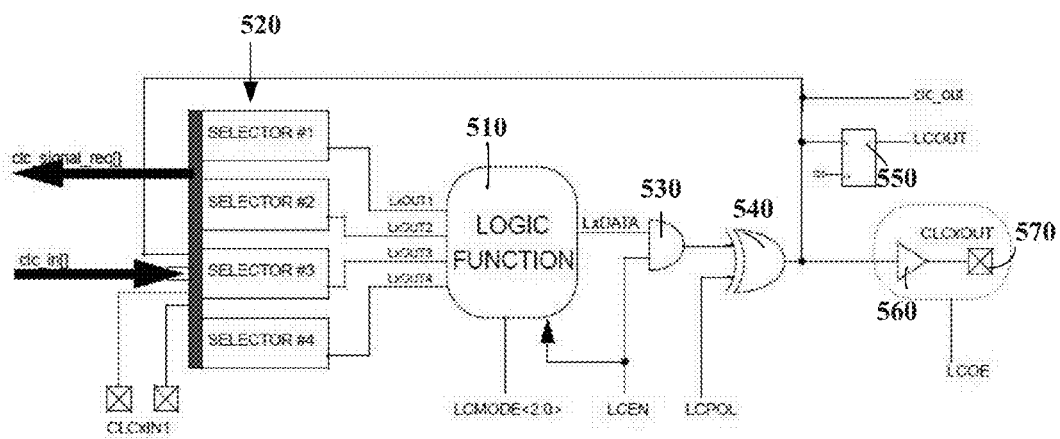
FIG. 5 shows an exemplary peripheral in form of a configurable logic device.

FIG. 5 shows an embodiment of a configurable logic cell. The core 510 includes the configurable logic function as will be explained in more detail below. The signal selection is performed by the selectors 520. Input signals may include two external signals CLC×IN1 which can be connected to external pins. Furthermore additional internal signals clc_in[ ] may be available. A bus structure may be used to feed these signals to the selector units 520 which may be formed as discussed above. The output of the logic function cell 510 may be connected with additional logic as shown with the AND gate 530, OR gate 540 and the Flip-Flop 550. A driver 560 may be used to provide the output signal to an external pin 570. Reference symbol clc_out indicates the internal output signal which may also be fed back to the input bus and used as one of the selectable input signals. Signals LxMODE<2:0> may be provided by a configuration register and select the logic function as will be explained in more detail below.

Figure 6:
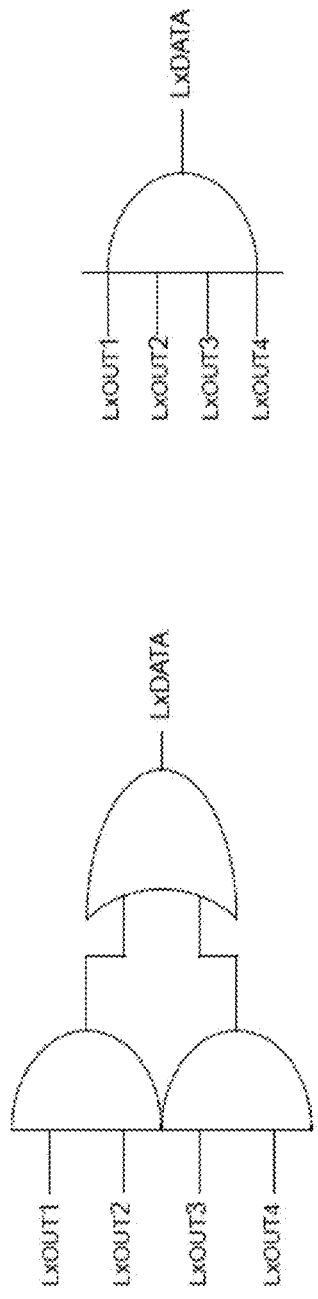
FIGS. 6 and 7 show exemplary selectable logic functions for the logic device shown in FIG. 5.
Figure 6:
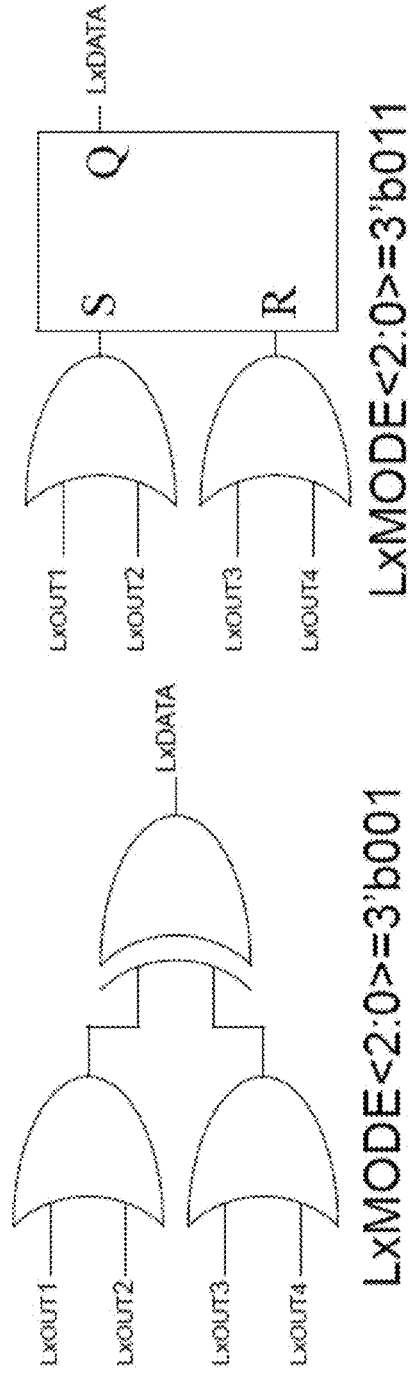
Figure 7:
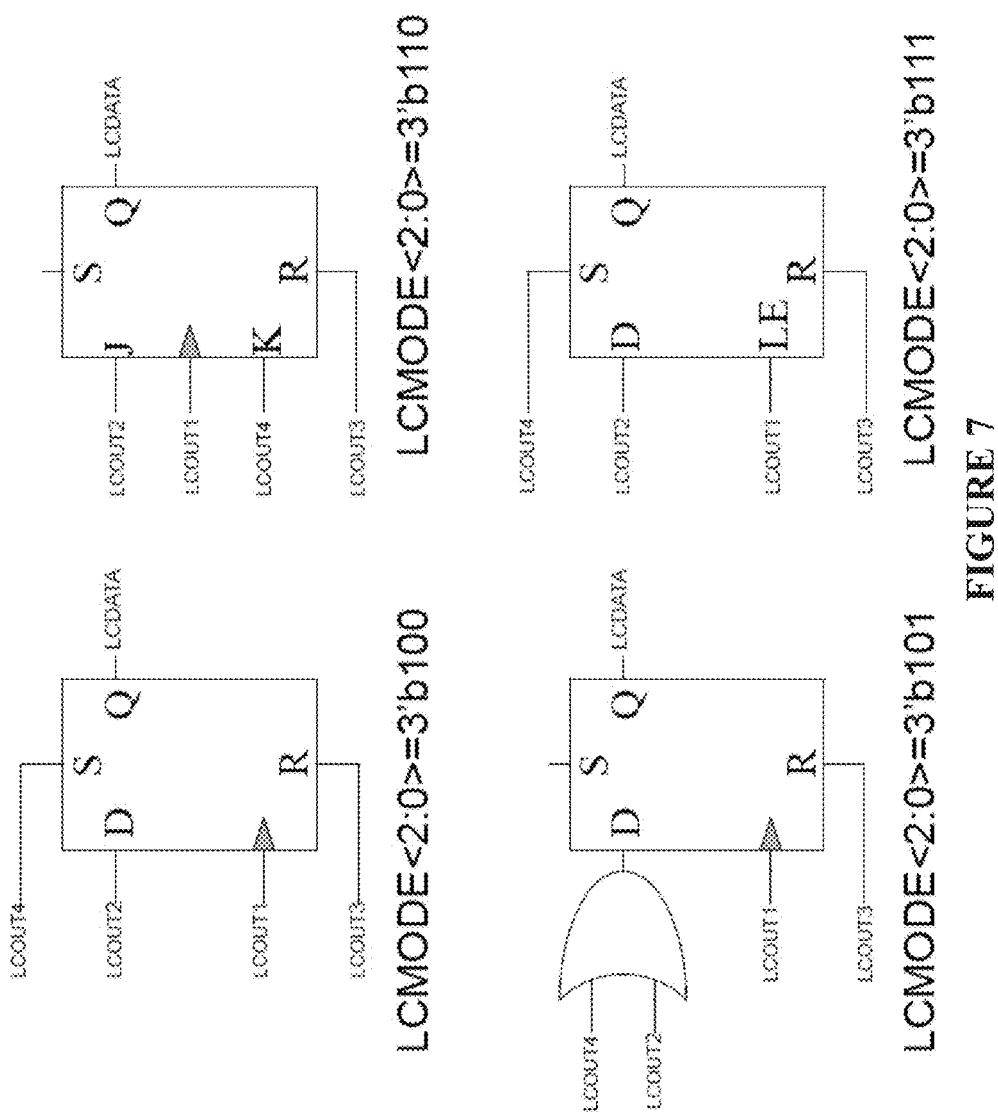
Figure 9:
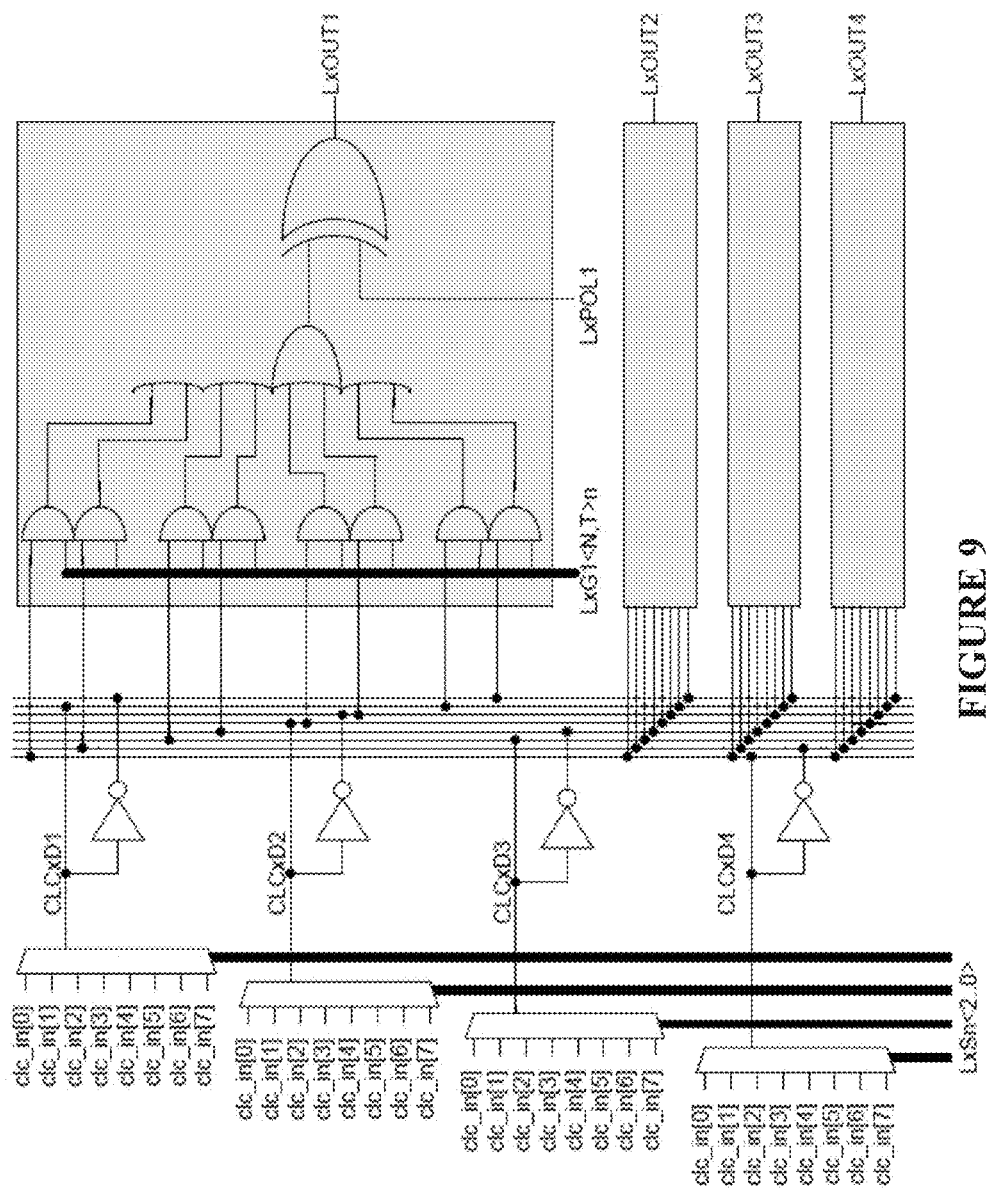
FIG. 9 shows a second mode of the configurable logic device shown in FIG. 8.

The mode control signal LxMODE according to one embodiment includes 3 bits <2:0>. This allows for eight different settings. FIG. 6 shows four possible logic functions that can be selected when the highest bit is set to 0. The other four functions are shown in FIG. 9 and are available when the highest bit of the three control bit is set to 1. More or less functions can be provided by adapting the number of control bits.

Figure 8:
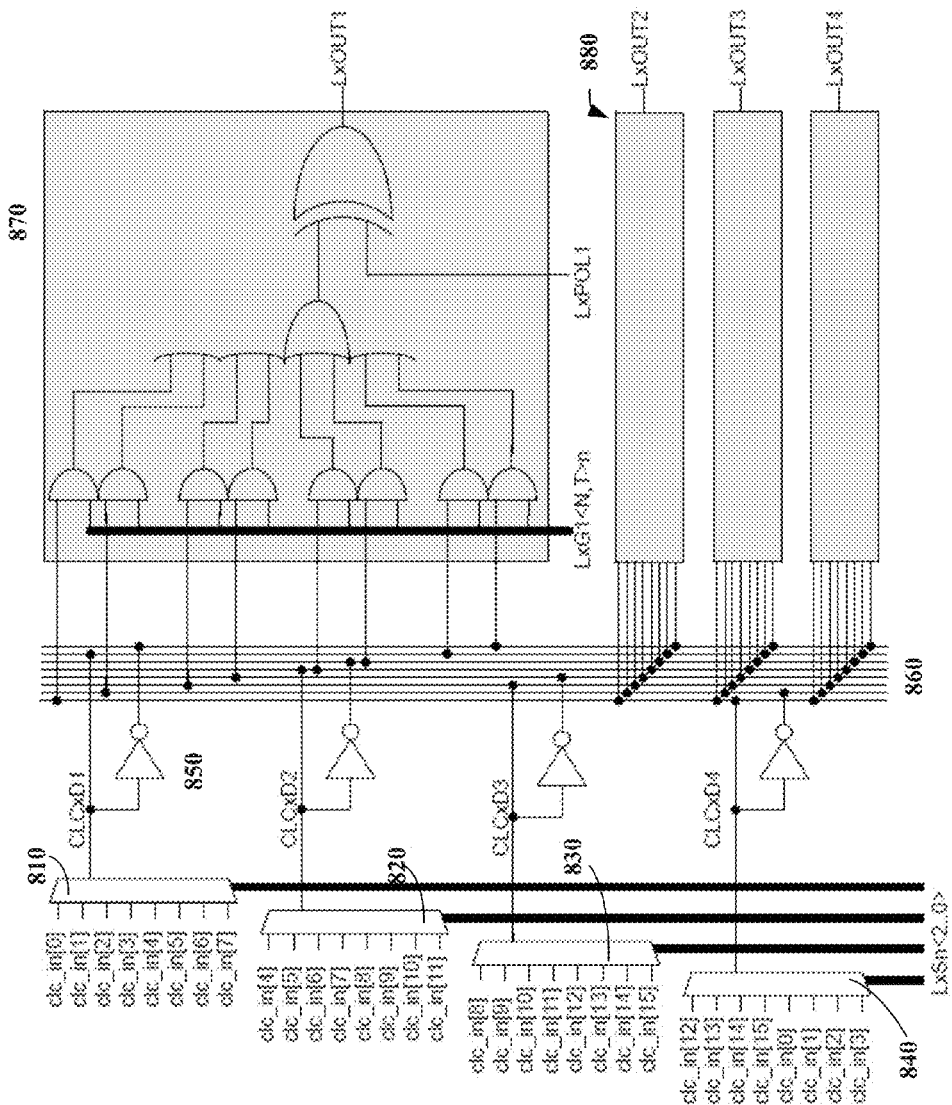
FIG. 8 shows a first mode of an embodiment of a configurable logic device.

FIG. 8 shows an embodiment using again four 8-to-1 multiplexers 810 . . . 840. Each of the four selected output signals is also fed to a respective inverter 850 and, thus, eight input signals are available in input bus 860. A logic cell 870 may include configurable logic as discussed above and may be controlled by additional control signals LxG1 to select whether an inverted or non-inverted input signal is to be used. Furthermore, as shown in FIG. 8, additional logic cells 880, for example three additional cells, can be connected to the input bus 860. However, more or less cells can be used according to the requirements of a configurable logic device. FIG. 9, shows the same device as shown in FIG. 8 however, operating in a different mode. In this mode, the number of source signals is reduced to eight input signals clc_in[0 . . . 7] and each input signal is fed to one of the inputs of the four multiplexers. A selection logic for programming the mode shown in FIGS. 8 and 9 will be discussed below.

Thus, generally, a switching matrix may operate in a plurality of operating modes programmed in a mode register, wherein in each mode, a different set of input signals is assigned to the input of the n-to-1 multiplexers. For example, in a two operation mode switching matrix, in a first mode programmed in a mode register the switching matrix operates to assign the different input sets with overlapping input signals to the plurality of n-to-1 multiplexers and in a second mode, the switching matrix assigns a first input set to all n-to-1 multiplexers. The second mode can differ in providing different assignments or additional assignment modes may be provided. For example, in one mode at least a first input set can be assigned to at least one n-to-1 multiplexers and at least a second input set with no input signals overlapping with the first input set to at least another n-to-1 multiplexer. The first set can be used for more than one n-to-1 multiplexer or each n-to-1 multiplexer can have a set of input signals that does not overlap at all. As mentioned above, more than two modes may be provided. Thus, a user can select between a variety of different assignments of various input signals to the respective set of input signals assigned to each n-to-1 multiplexer.

Figure 10:
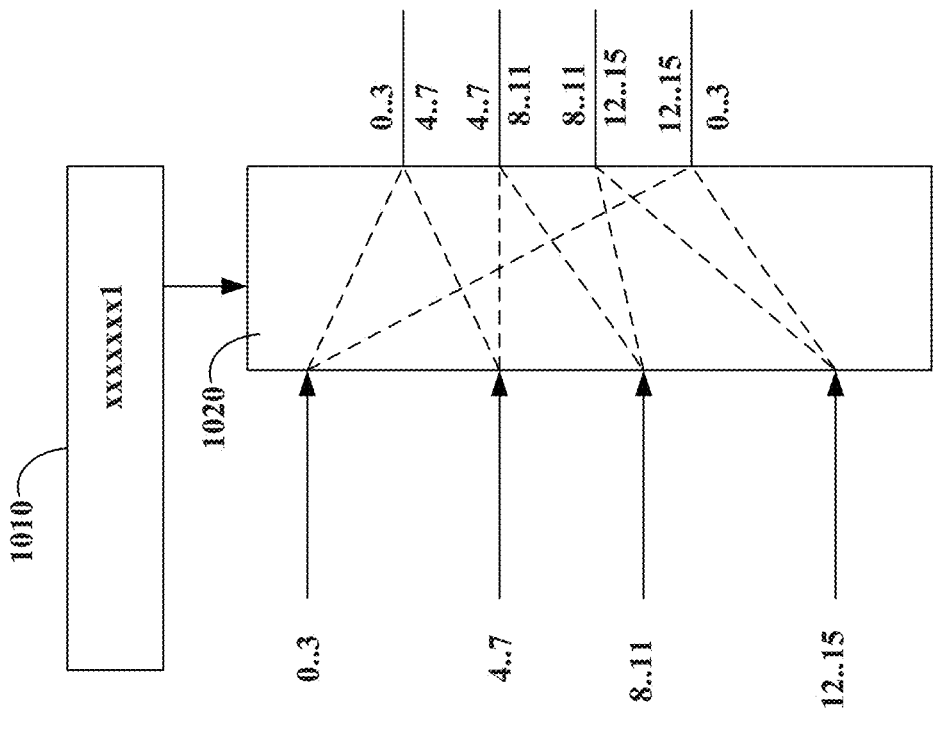
FIG. 10 shows control logic to provide for a programmable mode switch.
Figure 10:
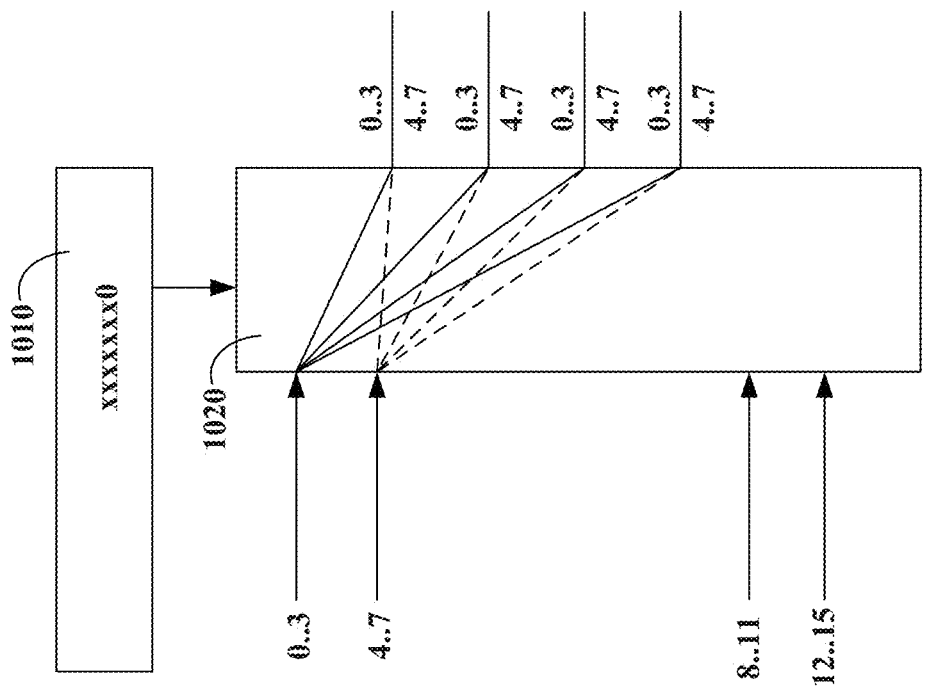

FIG. 10 shows a suitable switching matrix that can be used to provide for example two operating modes of the logic cells. To this end, a configuration register 1010 is provided wherein a single bit may indicate whether the configurable logic cells operate in the first or second mode. This bit controls the input selection function of a switching matrix 1020 as shown in FIG. 10. Switching matrix 1020 couples the four sub-groups of selectable input lines 0 . . . 3, 4 . . . 7, 8 . . . 11, and 12 . . . 15 to either connect these groups to form a conventional selection scheme in which eight input signals are coupled with eight inputs of all respective selection multiplexers. This mode is shown on the left side of FIG. 10 and corresponds to the coupling scheme shown in FIG. 9. The second mode is shown on the right side. In this mode, the coupling scheme as discussed with respect to FIG. 4 or 8 can be accomplished. One or more further modes could be easily added to provide for example, for the functionality as discussed above, for example the mode shown in FIG. 3.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for selecting signals from a plurality of y signals in a device, comprising
   a switching matrix receiving y input signals,
   a plurality of multiplexers coupled with the switching matrix, each multiplexer having n inputs, one or more control inputs, and a single output, wherein each multiplexer receives a set of n of said y signals,
   a mode register coupled with the switching matrix allowing to program one of a plurality of assignment modes, wherein
      in a first assignment mode the switching matrix operates to assign each multiplexer to a different set of n of said y signals, wherein each set of n signals is divided into a plurality of subsets of input signals, wherein one of the subsets of each multiplexer comprises more than one and less than n input signals and is also a subset of input signals of another multiplexer, and
      in a second assignment mode, the switching matrix assigns an identical set of input signals from said y input signals to all of the plurality of independently controlled multiplexers.

2. The apparatus according to claim 1, wherein the selected signals are fed to a peripheral device.

3. An apparatus according to claim 2, wherein the peripheral device is a programmable logic cell within a microcontroller.

4. The apparatus according to claim 1 for selecting four (4) signals from sixteen (16) signals, comprising:

first, second, third and fourth multiplexers, each of the
multiplexers having eight (8) inputs and one (1) output;
wherein in the first assignment mode:
input signals 0 to 3 are coupled respectively to four inputs
of the first and fourth multiplexers,
input signals 4 to 7 are coupled respectively to another
four inputs of the first multiplexer and four inputs of the
second multiplexer,
input signals 8 to 11 are coupled respectively to another
four inputs of the second multiplexer and four inputs of
the third multiplexer, and
input signals 12 to 15 are coupled respectively to another
four inputs of the third multiplexer and another four
inputs of the fourth multiplexer;
whereby 3 out of 8 of the sixteen signals can be selected
by three of the four multiplexers and 1 out of the other
8 of the sixteen signals can be selected by the fourth
multiplexer.

5. An apparatus for selecting a plurality of input signals from a plurality of y signals in a device, comprising:
a switching matrix receiving y input signals,
a plurality of independently controlled n-to-1 multiplexers coupled with said switching matrix,
a mode register coupled with the switching matrix allowing to program one of a plurality of assignment modes, wherein
in a first assignment mode the switching matrix operates to assign each n-to-1 multiplexer to a different input set of n of said y signals wherein each n-to-1 multiplexer comprises a plurality of subsets of input signals, wherein one of the subsets of each n-to-1 multiplexer comprises more than one and less than n input signals and is also a subset of input signals of another n-to-1 multiplexer, and
in a second mode, the switching matrix assigns at least a first set of n signals to at least one multiplexer of the plurality of independently controlled n-to-1 multiplexers and at least a second set of n signals with no input signals of the first set to at least another one of the plurality of independently controlled n-to-1 multiplexers.

6. An apparatus according to claim 5, wherein in the second mode, the first set of n signals is assigned to at least two multiplexers and the second set of n signals to at least two further multiplexers.

7. The apparatus according to claim 5, wherein in a third assignment mode, the switching matrix assigns a predefined set of n signals to all multiplexers.

8. The apparatus according to claim 5, wherein the selected signals are fed to a peripheral device.

9. The apparatus according to claim 8, wherein the peripheral device is a programmable logic cell within a microcontroller.

10. The apparatus according to claim 5 for selecting four (4) signals from sixteen (16) signals, comprising:
first, second, third and fourth multiplexers, each of the multiplexers having eight (8) inputs and one (1) output;
wherein in the first assignment mode:
input signals 0 to 3 are coupled respectively to four inputs of the first and fourth multiplexers,
input signals 4 to 7 are coupled respectively to another four inputs of the first multiplexer and four inputs of the second multiplexer,
input signals 8 to 11 are coupled respectively to another four inputs of the second multiplexer and four inputs of the third multiplexer, and
input signals 12 to 15 are coupled respectively to another four inputs of the third multiplexer and another four inputs of the fourth multiplexer;
whereby 3 out of 8 of the sixteen signals can be selected by three of the four multiplexers and 1 out of the other 8 of the sixteen signals can be selected by the fourth multiplexer.

11. A method for selecting signals from a plurality of y signals in a device by a plurality of multiplexers, each multiplexer having n inputs, one or more control inputs, and 1 output, the method comprising:
selecting an assignment mode from a plurality of assignment modes, wherein
in a first assignment mode: assigning inputs of each multiplexer of the plurality of multiplexers to a set of n signals of said y signals, each set of n signals of a multiplexer being different from a set of respective other multiplexers of the plurality of multiplexers, wherein each set of n signals is divided into a plurality subsets of input signals, wherein one of the subsets of each multiplexer comprises more than one and less than n input signals and is also a subset of input signals of another multiplexer, and
in a second assignment mode: assigning an identical set of input signals from said y signals to all multiplexers of the plurality of multiplexers;
and
independently controlling each multiplexer to select an input signal.

12. The method according to claim 11, further comprising feeding the selected signals to a peripheral device.

13. The method according to claim 12, wherein the peripheral device is a programmable logic cell within a microcontroller.

14. The method according to claim 11 for selecting four (4) signals from sixteen (16) inputs, said method comprising in the first assignment mode:
providing first, second, third and fourth multiplexers, wherein each of the multiplexers have eight (8) inputs and one (1) output;
coupling a first four data signals to four inputs of the first and fourth multiplexers, respectively;
coupling a second four data signals to another four inputs of the first multiplexer and four inputs of the second multiplexer, respectively;
coupling a third four data signals to another four inputs of the second multiplexer and four inputs of the third multiplexer, respectively, and
coupling a fourth four data signals to another four inputs of the third multiplexer and another four inputs of the fourth multiplexer, respectively;
whereby three out of eight of the sixteen signals can be selected by three of the four multiplexers and one out of the other eight of the sixteen signals can be selected by the fourth multiplexer.

15. A method for selecting a plurality of input signals from a plurality of y signals in a device by a plurality of n-to-1 multiplexers, comprising:
selecting an assignment mode from a plurality of assignment modes, wherein
in a first assignment mode: assigning each of the plurality of n-to-1 multiplexer to a different input set consisting of n input signals of said y signals wherein each n-to-1 multiplexer comprises a plurality subsets of input signals, wherein one of the subsets of each of the plurality of n-to-1 multiplexer comprises more than one and less than n input signals and is also a subset of input signals of another one of the plurality of n-to-1 multiplexer, and in a second assignment mode, at least a first set of n signals is assigned to at least one of the plurality of n-to-1 multiplexers and at least a second set of n signals with no input signals of the first set is assigned to at least another one of the plurality of n-to-1 multiplexers.

16. The method according to claim 15, wherein in the second assignment mode, the first set is assigned to at least two multiplexers and the second set to at least two further multiplexers.

17. The method according to claim 15, wherein in a third assignment mode, a predefined set of n signals is assigned to all multiplexers.

18. The method according to claim 15, further comprising feeding the selected signals to a peripheral device.

19. The method according to claim 18, wherein the peripheral device is a programmable logic cell within a microcontroller.

20. The method according to claim 15 for selecting four (4) signals from sixteen (16) inputs, said method comprising in the first assignment mode:
   providing first, second, third and fourth multiplexers, wherein each of the multiplexers have eight (8) inputs and one (1) output;
   coupling a first four data signals to four inputs of the first and fourth multiplexers, respectively;
   coupling a second four data signals to another four inputs of the first multiplexer and four inputs of the second multiplexer, respectively;
   coupling a third four data signals to another four inputs of the second multiplexer and four inputs of the third multiplexer, respectively, and
   coupling a fourth four data signals to another four inputs of the third multiplexer and another four inputs of the fourth multiplexer, respectively;
   whereby three out of eight of the sixteen signals can be selected by three of the four multiplexers and one out of the other eight of the sixteen signals can be selected by the fourth multiplexer.

21. A microcontroller comprising:
   a central processing unit;
   a programmable logic peripheral which is programmable by said central processing unit;
   an input signal selection unit configured to receive a plurality of y signals and to select input signals from said y signals for the programmable logic peripheral, wherein the input selection unit comprises:
   a switching matrix receiving the v signals;
   a plurality of multiplexers, each having n inputs, one or more control signals, and a single output, wherein each multiplexer receives a set of n of said y signals,
   a mode register coupled with the switching matrix allowing to program one of a plurality of assignment modes, wherein
      in a first assignment mode the switching matrix operates to assign each set of n signals of each multiplexer to a different input set of of n of said y signals, wherein each input set of n signals is divided into a plurality of subsets of input signals, wherein one of the subsets of each multiplexer comprises more than one and less than n input signals and is also a subset of input signals of another multiplexer, and
      in a second assignment mode, the switching matrix assigns an identical set of input signals from said y input signals to all of the plurality of independently controlled n-to-1 multiplexers.

22. The microcontroller according to claim 21, wherein in a third mode, the input signal selection unit assigns at least a first set of n signals to at least one multiplexer and at least a second set of n signals with no input signals of the first set to at least another multiplexer.

23. The microcontroller according to claim 22, wherein in a third mode, the first set of n signals is assigned to at least two multiplexers and the second set of n signals to at least two further multiplexers.

24. The microcontroller according to claim 21, wherein the y signals are provided at least one external pin and at least one output signal from a digital peripheral.

* * * * *

UNITED STATES PATENT AND TRADEMARK OFFICE
CERTIFICATE OF CORRECTION

| | |
|---|---|
| PATENT NO. | : 9,450,585 B2 |
| APPLICATION NO. | : 13/449687 |
| DATED | : September 20, 2016 |
| INVENTOR(S) | : Kevin Lee Kilzer et al. |

It is certified that error appears in the above-identified patent and that said Letters Patent is hereby corrected as shown below:

Claims,

Column 10,
Claim 21, line 17, "...multiplexer to a different input set of of n of said y signals,..."
---Change to--- "...multiplexer to a different input set of n of said y signals..."

Signed and Sealed this
Eighth Day of November, 2016

Michelle K. Lee
*Director of the United States Patent and Trademark Office*